(12) United States Patent
Tourné

(10) Patent No.: US 7,178,994 B2
(45) Date of Patent: Feb. 20, 2007

(54) FIBER OPTIC CIRCUIT CONNECTOR

(75) Inventor: Joseph A. A. M. Tourné, Helmond (NL)

(73) Assignee: Viasystems Group, Inc., St. Louis, MO (US)

( * ) Notice: Subject to any disclaimer, the term of this patent is extended or adjusted under 35 U.S.C. 154(b) by 0 days.

(21) Appl. No.: 11/311,616

(22) Filed: Dec. 19, 2005

(65) Prior Publication Data

US 2006/0098914 A1 May 11, 2006

Related U.S. Application Data

(63) Continuation of application No. 10/825,980, filed on Apr. 16, 2004, now Pat. No. 6,976,793, which is a continuation of application No. 10/051,418, filed on Oct. 30, 2001, now Pat. No. 6,848,840.

(60) Provisional application No. 60/244,390, filed on Oct. 31, 2000.

(51) Int. Cl.
*G02B 6/36* (2006.01)
(52) U.S. Cl. .......................... 385/89; 385/92
(58) Field of Classification Search ............... 385/88
See application file for complete search history.

(56) References Cited

U.S. PATENT DOCUMENTS

| 4,184,740 A | 1/1980 | d'Auria et al. |
| 4,465,333 A * | 8/1984 | Caserta et al. ................. 385/73 |
| 4,496,215 A * | 1/1985 | Shaheen et al. ............ 385/114 |
| 4,658,130 A | 4/1987 | Durbin |
| 4,678,264 A * | 7/1987 | Bowen et al. ................. 385/89 |
| 4,753,510 A | 6/1988 | Sezerman |
| 4,813,760 A * | 3/1989 | Tanaka et al. ................. 385/62 |
| 4,945,400 A * | 7/1990 | Blonder et al. .............. 257/116 |
| 4,993,803 A | 2/1991 | Suverison et al. |
| 5,163,109 A | 11/1992 | Okugawa et al. |
| 5,233,677 A * | 8/1993 | Winslow ...................... 385/89 |
| 5,355,429 A * | 10/1994 | Lee et al. .................... 385/136 |
| 5,810,048 A | 9/1998 | Zeiner-Gundersen |
| 6,004,043 A | 12/1999 | Abendschein et al. |

(Continued)

FOREIGN PATENT DOCUMENTS

EP 0454502 10/1991

(Continued)

OTHER PUBLICATIONS

Japanese Publication No. 2000-249873, publication date-Sep. 14, 2000, Application date-Feb. 25, 1999, Title: Electronic Circuit Integrated Optical Transmission Module and Its Production, English language abstract attached.

(Continued)

*Primary Examiner*—Ellen E. Kim
(74) *Attorney, Agent, or Firm*—Dunlap, Codding & Rogers, P.C.

(57) ABSTRACT

A circuit board uses both electrical and optical connectors to carry signals in both electrical and light form. The optical connector employs redundant alignment features to provide for reliable connectivity between plug in boards and the electro-optic back plane. A process is of forming the back plane and other multilevel circuit boards so as to embed optical connectors is disclosed.

5 Claims, 9 Drawing Sheets

U.S. PATENT DOCUMENTS

| | | | |
|---|---|---|---|
| 6,229,942 B1* | 5/2001 | Engberg et al. | 385/39 |
| 6,234,688 B1 | 5/2001 | Boger et al. | |
| 6,257,771 B1 | 7/2001 | Okayasu | |
| 6,343,171 B1* | 1/2002 | Yoshimura et al. | 385/50 |
| 6,402,389 B1* | 6/2002 | Steijer et al. | 385/65 |
| 6,402,395 B1 | 6/2002 | Bach | |
| 6,422,761 B1* | 7/2002 | Naghski et al. | 385/73 |
| 6,490,392 B1* | 12/2002 | Munekata et al. | 385/31 |
| 6,694,068 B2 | 2/2004 | Parker | |
| 6,771,860 B2 | 8/2004 | Trezza et al. | |
| 6,782,181 B2* | 8/2004 | Tourne | 385/136 |
| 7,033,084 B2* | 4/2006 | Lappohn | 385/73 |
| 2002/0150343 A1 | 10/2002 | Chiu et al. | |
| 2002/0176671 A1 | 11/2002 | Tourne | |
| 2003/0085452 A1 | 5/2003 | Brezina et al. | |
| 2004/0005134 A1 | 1/2004 | Sun et al. | |
| 2004/0008964 A1* | 1/2004 | Tourne | 385/136 |

FOREIGN PATENT DOCUMENTS

| | | |
|---|---|---|
| EP | 0677757 | 10/1995 |
| WO | WO 9900806 | 1/1999 |
| WO | WO 9945421 | 9/1999 |

OTHER PUBLICATIONS

Picard A., et al., High Precision LIGA Structures for Optical Fibre-In-Board Technology, pp. 77-80, Jan. 31, 1996.
Japanese Publication No. 02 087107, publication date-Mar. 28, 1990, Application date-Sep. 26, 1998, Title: Substrate with Optical Connector, English language abstract attached.

* cited by examiner

FIBER OPTIC CIRCUIT CONNECTOR

CROSS-REFERENCE TO RELATED APPLICATIONS

This application is a continuation of U.S. Ser. No. 10/825,980, filed Apr. 16, 2004 now U.S. Pat. No. 6,976,793, which is a continuation of U.S. Ser. No. 10/051,418, filed Oct. 30, 2001, now U.S. Pat. No. 6,848,840, which claims priority under 35 U.S.C. § 119(e) from U.S. Provisional Application No. 60/244,390, filed Oct. 31, 2000, all of which are hereby incorporated herein by reference in their entirety.

INTRODUCTION

The present invention relates generally to the field of optical connectors for circuit boards. More particularly, the present invention relates to electro-optical back plane circuit boards that have both electrical and optical connectors.

BACKGROUND OF THE INVENTION

Electronics devices are becoming increasingly integrated with optical systems. This has given rise to the need to integrate electronics and optics together into printed circuit board systems. Currently, this integration is somewhat awkward. Although printed circuit wiring is a fairly mature technology, the mixing of printed circuit wiring with optical conduction paths is still at an awkward stage of development.

Additionally, the connectors for interfacing optical conduction paths on circuit boards with fibers off-board is still a challenge. Specifically, aligning the off-board optical fibers with the connectors on the board remains a reliability problem.

Thus, what is needed is a printed circuit board configuration that reliably integrates electrical conduction with optic conduction, including stable optical connectors.

SUMMARY OF THE INVENTION

One aspect of the present invention is an optical connector for use in a multilayer circuit board.

Another aspect of the present invention is a method for forming an electro-optical multilayer circuit board having embedded optical connectors.

It is also an aspect of the present invention to embed an optical connector in a multilayer circuit board using a guide plate and pins to align the optical connector with the various layers of the circuit board.

An additional aspect of the present invention is an electro-optical back plane having both electrical connectors and optical connectors.

One embodiment of the present invention is an optical connector for use with an electro-optical board. The optical connector includes a right angle interface body that has one or more first optical paths and one or more second optical paths. Each of the first optical paths corresponding to a respective second optical path, and the first optical paths are disposed in a first plane and the one or more second optical paths are disposed in a second plane. The first and second planes being substantially at right angles with respect to one another. The optical connector also includes a female self-alignment body that has a tapered channel substantially aligned with the first plane. The optical connector further includes a tapered male self-alignment body sized to fit closely into the tapered channel of the female self-alignment body, and having one or more third optical paths adapted to align with the first optical paths when the tapered male self-alignment body is engaged with the female self-alignment body. The third optical paths are adapted for connection to one or more optical fibers disposed outside the electro-optical board. The second optical paths are adapted for connection to optical fibers embedded in the electro-optical board.

Another embodiment of the present invention is a method of integrating into an optical-electrical board an optical connector that includes a right angle interface body, a female self-alignment body having a tapered channel, and an anchor body. The method includes the steps of connecting the right angle interface body to a set of one or more optical fibers, and embedding the right angle interface body and the one or more optical fibers inside the optical-electrical board. The method also includes the steps of forming a hole in the optical-electrical board to expose an upper surface of the embedded right angle interface body, securely fastening the anchor body about the hole, and inserting the female self-alignment body through the anchor body and the hole so as to bring the tapered channel into registration with the embedded right angle interface body.

Yet another embodiment of the present invention is an electro-optical back plane. The electro-optical back plane includes a fiber management system formed of plural optical fibers, an electrical bus circuit, and a board, wherein the fiber management system and the electrical bus circuit are embedded inside the board. The electro-optical back plane further includes plural optical connectors disposed on the board, each of the optical connectors being coupled to one or more of the plural optical fibers of the fiber management system. Additionally, the electro-optical back plane includes plural electrical connectors disposed on the board, each of the electrical connectors being electrically connected to the electrical bus circuit. Each of the optical connectors includes a right angle interface body embedded into the board for connection to one or more fibers of the fiber management system, an anchor body securely fastened to the surface of the board, and a female self-alignment body having a tapered channel. The female self-alignment body is held by the anchor body so that the tapered channel is in registration with an upper surface of the right angle interface body.

BRIEF DESCRIPTION OF THE DRAWINGS

Additional objects and advantages of the present invention will be apparent in the following detailed description read in conjunction with the accompanying drawing figures.

DETAILED DESCRIPTION OF THE PREFERRED EMBODIMENTS

Figure 1:
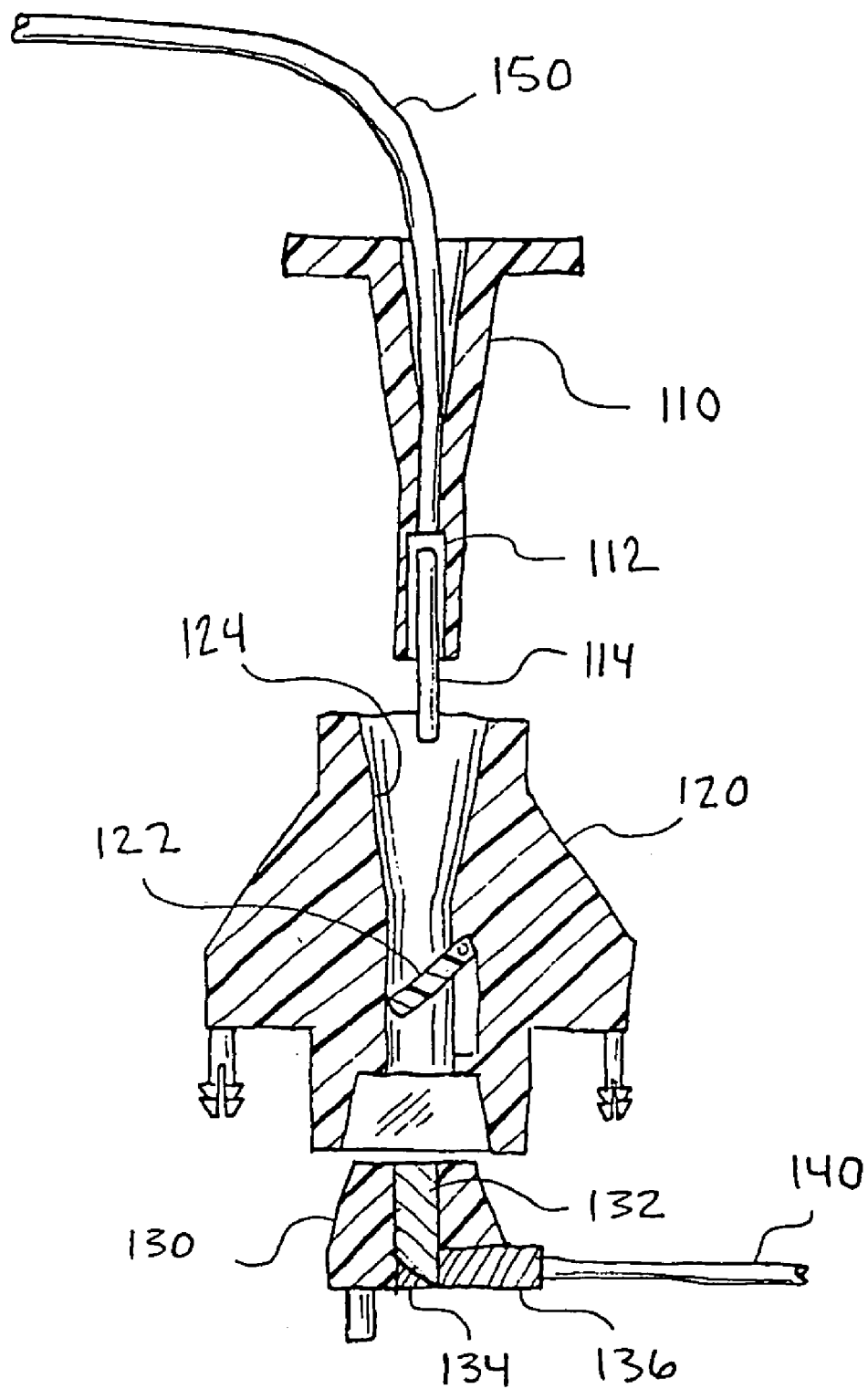
FIG. 1 illustrates a sectional exploded view of parts of an optical connector according to an embodiment of the present invention.

Referring to FIG. 1, and exploded sectional view of a connector according to an embodiment of the present invention is illustrated. A male connector portion 110 is insertable into a female connector portion 120. The male and female connector portions 110, 120 are tapered to fit together so as to provide a self-aligning function. A micro machined optical conductor assembly 112 in the male connector portion 110 is cause to be brought into precise alignment with another micro machined optical conductor assembly 132 disposed in a right angle interface body 130. The female connector portion 120 guides the male connector portion 110 into precise registration with the right angle interface body 130.

The housing parts of the optical connector are preferably formed of a high Tg material. Polyetherimide resins, and in particular ULTEM® resin (a product of GE), have been found to be a suitable as housing material to embody the invention.

The right angle interface body 130 is to be embedded inside a multi-layer circuit board. The female connector portion 120 mounts on a surface of the multi-layer circuit board, with a lower portion thereof extending down into the circuit board to engage the right angle interface body 130. The micro machined optical conductor assembly 132 is disposed above an integrated mirror 134 that provided a 90° transition for light traveling through the connector. This reflected light also travels through an additional micro machined conductor assembly 136 that provides coupling to a plurality of optical fibers 140, which are embedded inside the multilayer circuit board.

An optional feature of the optical connector 100 according to this embodiment is a spring-loaded door 122 inside the tapered passageway 124 of the female connector portion 120. The spring-loaded door 122 provides two functions. First, it prevents debris from falling down n inside the connector and contaminating the optical interface surface 131 on the top of the right angle interface body 130. Secondly, the spring-loaded door 122 prevents light from being emitted through the tapered passageway 124 of the female connector portion 120 when no male connector portion 130 is inserted therein.

The female connector portion 120 is securely held to the surface of the multilayer circuit board via locking connectors 124 that are inserted into holes formed through the multilayer circuit board.

Off-board optical fibers 150 are connected into the male connector portion 110 so as to be in optical communication with the micro machined optical conductor assembly 112. In addition to the self-aligning feature provided by the matched tapering shape of the male and female connector portions 110, 120, precision of alignment of the optical connector is enhanced by alignment pins 114 extending from the male connector portion that interdigitate with precisely machined alignment holes (not shown in this view) formed in the top side of the right angle interface body 130.

Figure 2:
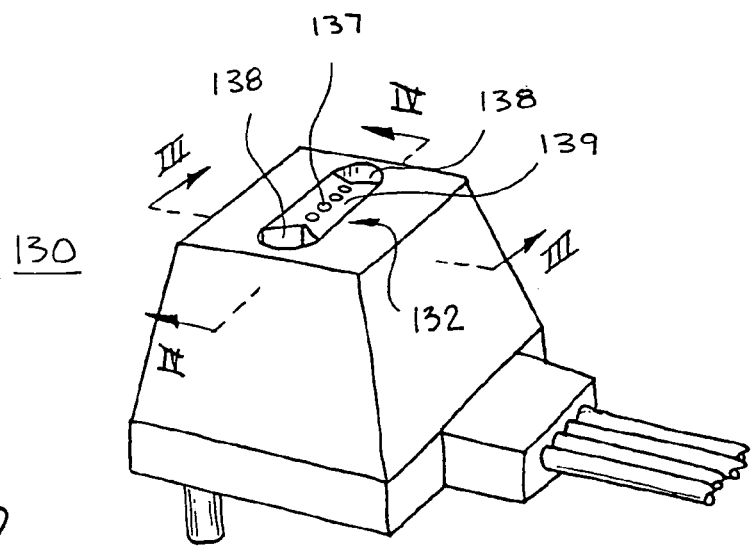
FIG. 2 illustrates a perspective view of a right angle interface body according to an embodiment of the present invention.

Referring to FIG. 2, a perspective view of the right angle interface body 130 is illustrated. The precision alignment holes 138 are disposed on either end of the optical conductor assembly 132. Plural optical conductors 137 (preferably glass fibers) embedded in a silicon body 139 to form the optical conductor assembly 132. The optical conductor assembly is principally formed of silicon. MT type optical connector devices have been found to be suitable for embodying these assemblies.

Figure 3:
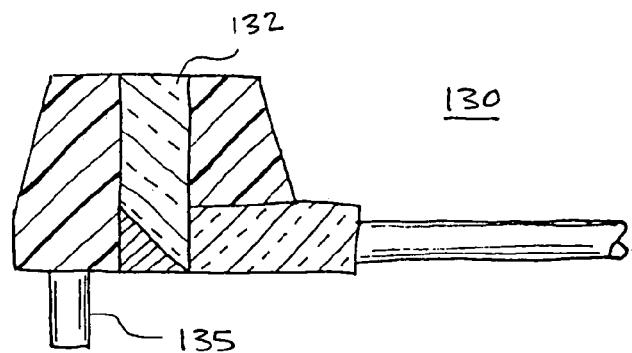
FIG. 3 illustrates a sectional view of the right angle interface body of FIG. 2.

Referring to FIG. 3, a sectional view of the right angle interface body 130 of FIG. 2 is illustrated. Anchor members 135 extend downward from the bottom side of the right angle interface body 130 to provide enhanced mechanical stability inside the multilayer circuit board.

Figure 4:
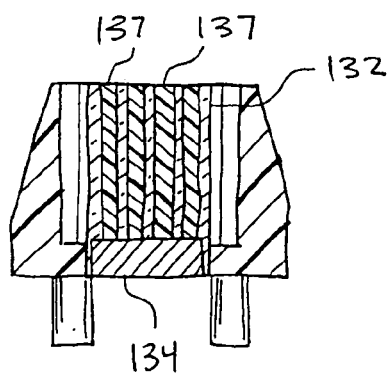
FIG. 4 illustrates another sectional view of the right angle interface body of FIG. 2 (orthogonal to the sectional view of FIG. 3).

Referring to FIG. 4, another sectional view of the right angle interface body 130 of FIG. 2 is illustrated. Extending upwardly from the integrated mirror 134 through the micro machined optical conductor assembly 132 are plural glass fibers 137.

Figure 5:
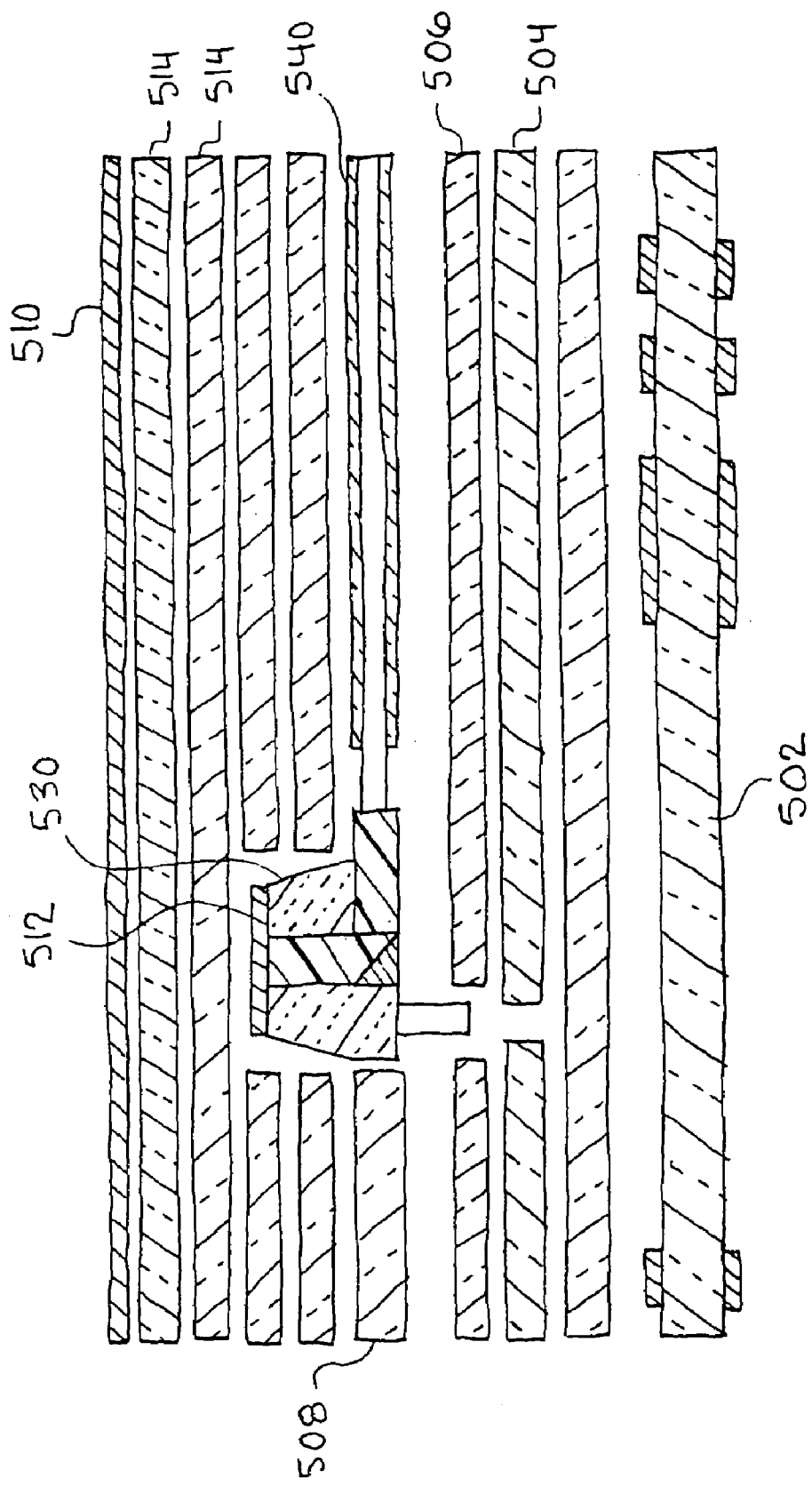
FIG. 5 illustrates an initial pre-assembly schematic view of various lamination layers for composing a multilayer printed circuit board according to an embodiment of the present invention.

Referring to FIG. 5, an initial pre-assembly schematic view is illustrated, showing the relative position of various lamination layers for composing the multi-layer printed circuit board. One layer is an electrical inner layer 502 according to known prior art practices. A registration plate 504 is provided to keep the board structure flat and having alignment holes to align and fix the optical connector during bonding. A prepreg layer 506 for bonding and embedding optical management structures is provided above the laminate layer 504. About the right angle interface body 530, a laminate layer 508 is provided with the perimeter of the fiber management system 540 being routed out to compensate for thickness differences. An adhesive copper tape 512 is layered onto the top surface of the right angle interface body 530 to protect the glass fibers, alignment holes, and other surrounding structures from later processing steps. The copper tape 512 is adhered to the top surface of the right angle interface body 530 by an adhesive. Preferably, the adhesive can withstand a temperature of at least 210° C. and will not leave behind excessive residue when the copper tape 512 is later removed. Above the additional lamination layers 514, an outer copper foil 510 is layered on as a top layer. The outer copper foil 510 is preferably about 18 micrometers in thickness.

The circuit board layers may be formed with any suitable materials that are known in the art. Standard circuit board materials are available from a number of manufacturers including Isola of the U.K., Nelco Products, Inc. of Fullerton, Calif., and Polyclad Laminates of Franklin, N.H.

Figure 6:
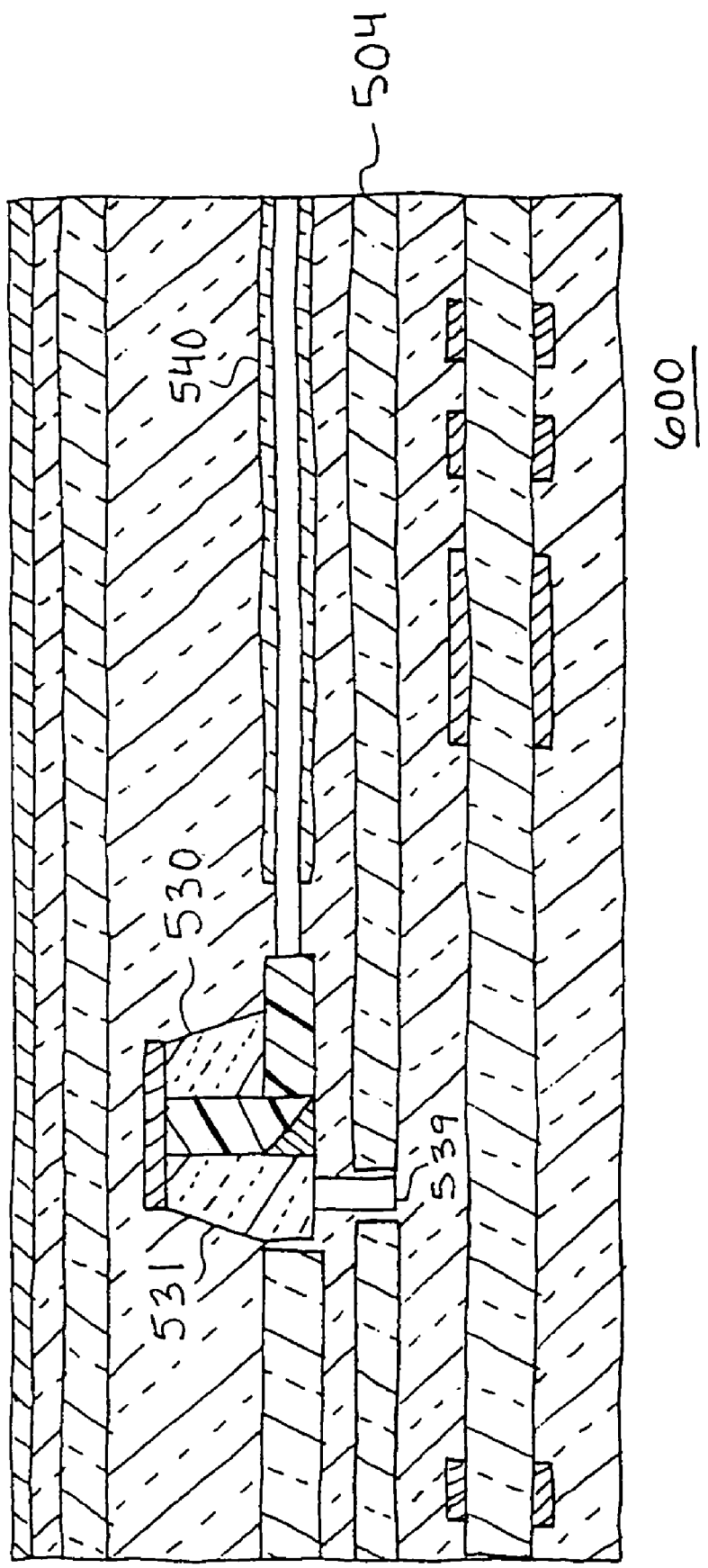
FIG. 6 illustrates a post-lamination cross sectional view of a multilayer circuit board according to a process embodiment of the present invention.

Referring to FIG. 6, a cross sectional view of the multilayer circuit board 600 is illustrated, post-lamination. The right angle interface body 530 is shown coupled to a fiber management system 540, with both being embedded inside a multi-layer printed circuit board 600. The right angle interface body 530, a basic alignment component of the entire optical connector, is aligned to the circuit board 600 via a registration plate 504. The registration plate 504 aligns and fixes the entire optical connector to the electrical pattern of the printed circuit board 600 by fixing the anchor members 539 into the registration plate 504. The registration plate 504 is aligned to the other layers of the multilayer printed circuit board 600 by using a traditional Lenkheit system.

The interlocking of the right angle interface body 530 with the registration plate 504 via the anchor members 539 aligns the optical connector both in the x-y plane of the board, as well as along the z axis.

It is noted that the right angle interface body 530 has angled sidewalls 531. These angled sidewalls 531 serve a dual purpose. One reason for having the angles sidewalls 531 is to facilitate cleaning around the interface body 530 with a laser that is used to ablate away the board layers above the interface body 530. The second useful purpose for the angled sidewalls is to provide for good alignment with the female connector portion.

Figure 7:
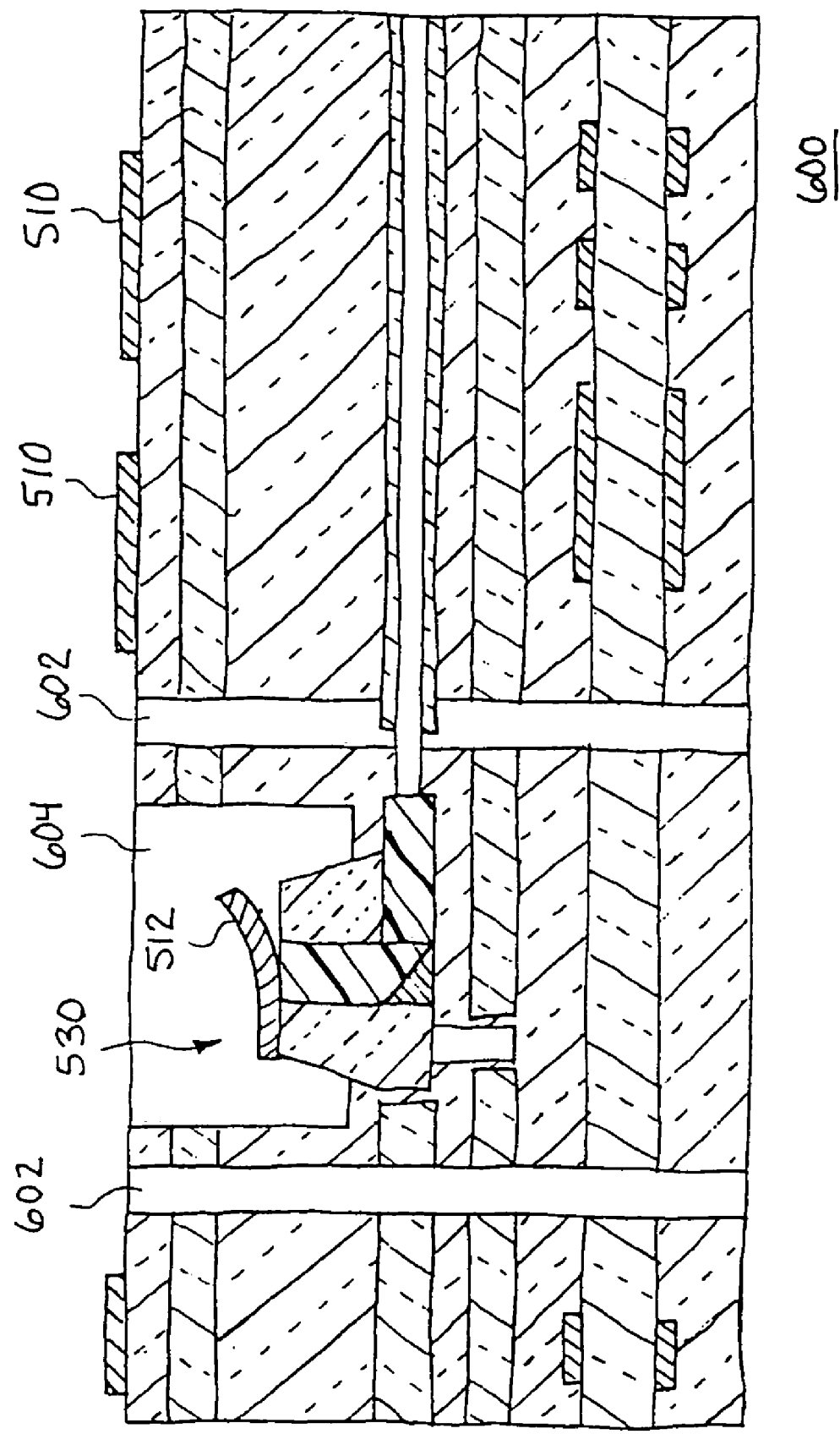
FIG. 7 illustrates a cross sectional view of a multilayer circuit board illustrating a machining step of a process embodiment of the present invention.

Referring to FIG. 7, the multilayer printed circuit board 600 is shown after machining steps have been conducted on the board. Holes 602 have been drilled through the board 600 for connecting the female connector portion 920 to the surface of the board. A hole 604 has been machined into the upper surface of the board 600 and so is to expose the right angle interface body 530. The outer copper foil layer 510 has also been etched to provide conductive runs. At this time the copper tape 512 on the top of the right angle interface body 530 may be pealed off and the top surface of the right angle interface body cleaned 530. The protective copper tape 512 is left on the top surface of the right angle interface body 530 until the board 600 has been electrically tested and finally inspected.

Figure 8:
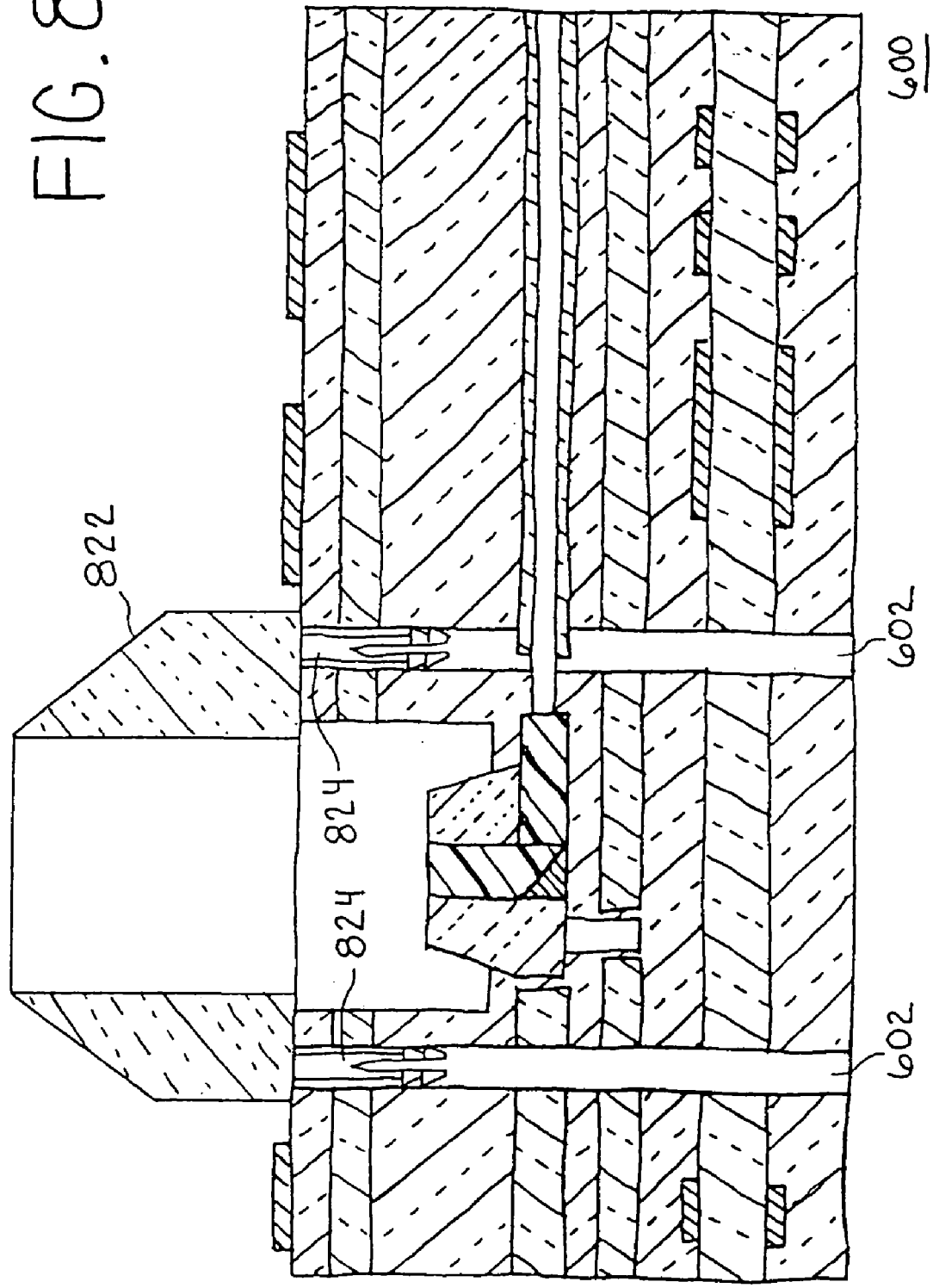
FIG. 8 illustrates a cross sectional view of a multilayer circuit board illustrating a connector assembly step of a process embodiment of the present invention.

Referring to FIG. 8, the first step of assembling the female connector portion is illustrated. An anchor body 822 is securely engaged to the surface of the board 600 by inserting its anchors 824 into the holes 602 drilled in the board 600.

Figure 9:
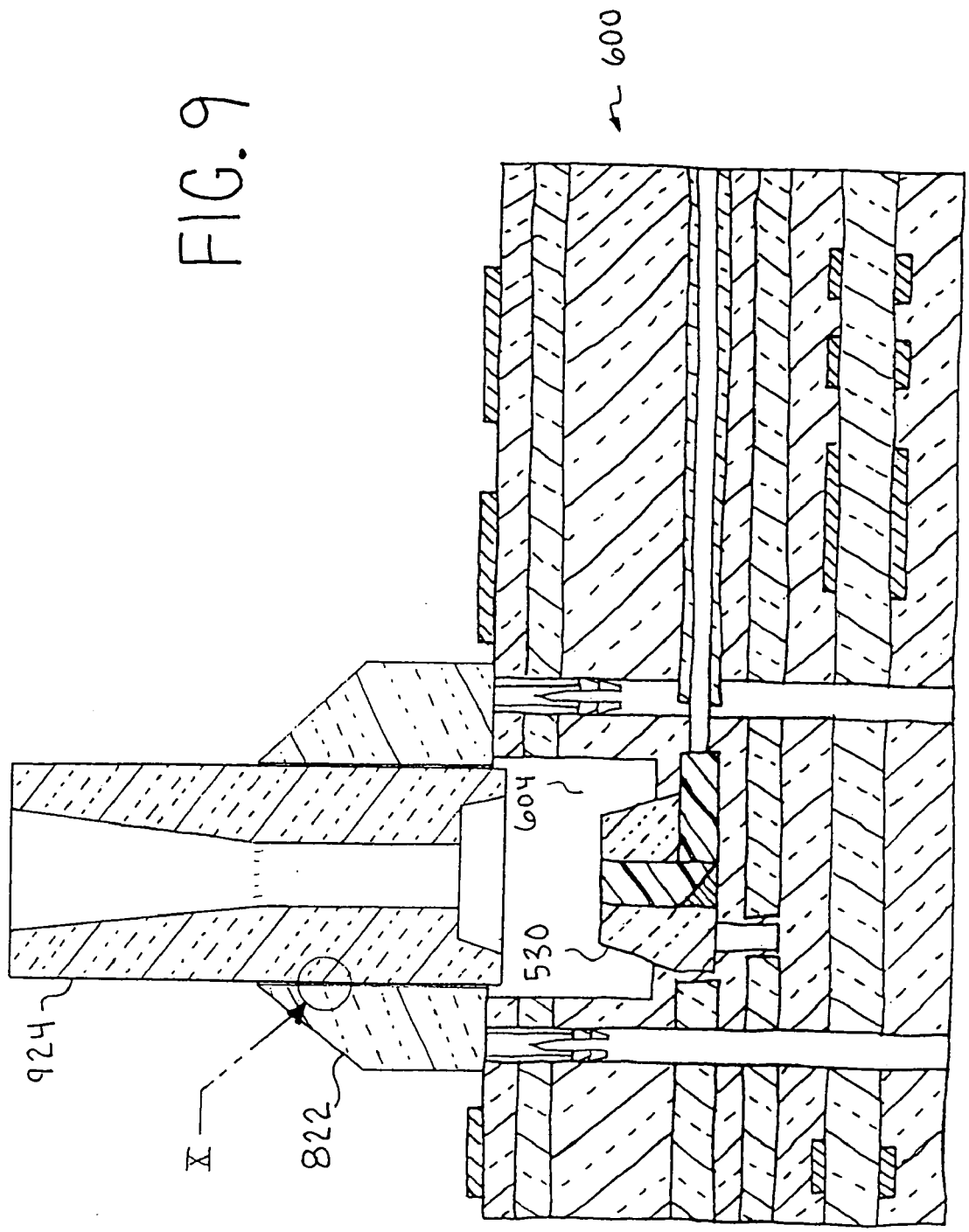
FIG. 9 illustrates a cross sectional view of a multilayer circuit board illustrating another connector assembly step of a process embodiment of the present invention.

Referring to FIG. 9, a second step of assembling the female connector portion is illustrated. A female self-alignment body 924 is forced downward through the anchor body 822 and into the machined out hole 604 in the board 600 until it aligns with the imbedded right angle alignment body 530.

Figure 10:
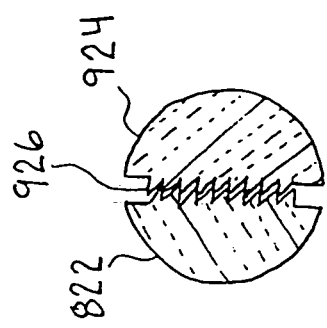
FIG. 10 illustrates a cross sectional detail view (per section line X in FIG. 9) showing the ratcheted interface between an anchor body and a female self-alignment body that form the female connector portion according to an embodiment of the present invention.

Referring to FIG. 10, a detail view of the interface between the anchor body 822 and the female self-alignment body 924 is illustrated. The anchor body 822 engages the female self-alignment body 924 via a one way ratchet 926.

Figure 11:
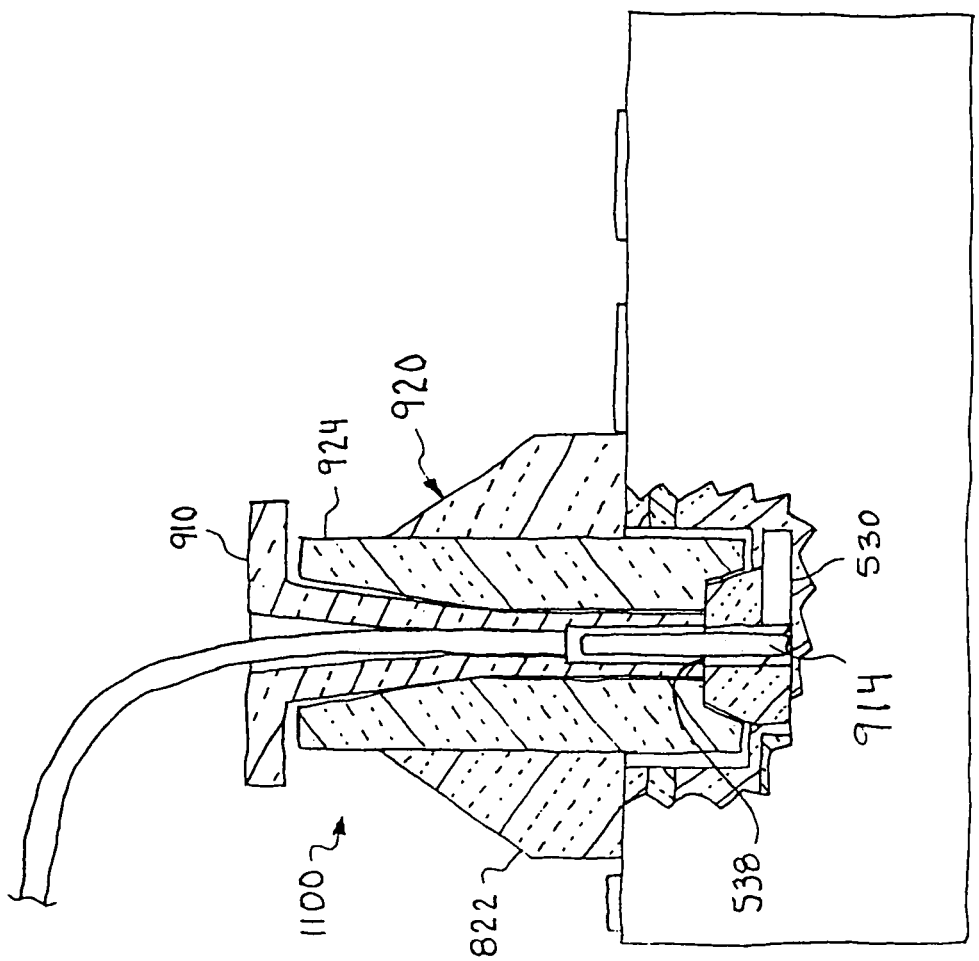
FIG. 11 illustrates a partial section view of a fully assembled optical connector according to an embodiment of the present invention.

Referring to FIG. 11, the fully assembled optical connector 1100 is illustrated in a partial section view. A male self-alignment body 910 is inserted down into the female self-alignment body 920 (formed by the combination of the anchor body 822 and the female self-alignment body 924) to guide the male connected portion into precise registration with the top surface of the right angle alignment body 530. To insure precision of engagement between the optical paths of the male connector portion 910 with the optical paths of the right angle alignment body 530. the alignment pins 914 of the male connector portion 910 are engaged with the precision machined holes 538 of the right angle alignment body 530.

Figure 12:
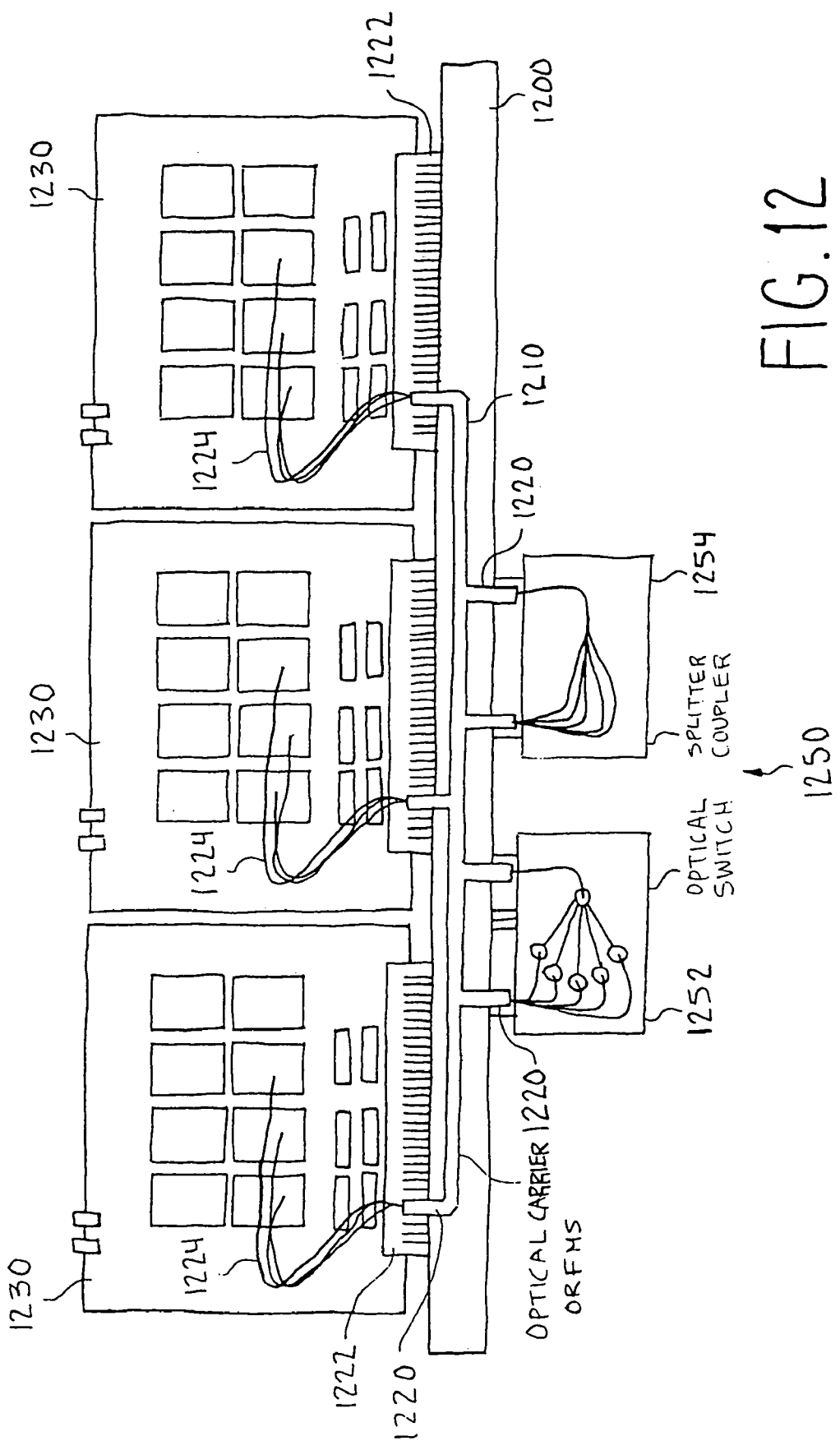
FIG. 12 illustrates a schematic view of an electro-optical back plane according to an embodiment of the present invention.

Referring to FIG. 12, an electro-optical back plane 1200 according to an embodiment of the present invention is illustrated. The back plane 1200 has an optical carrier 1210 (preferably a fiber management system) embedded with a number of optical connectors 1220 according to embodiments of the present invention. For interfacing printed circuit boards 1230 to the electro-optical back plane 1200, optical connectors 1220 are placed adjacent to electrical connectors 1222. The printed circuit boards 1230 are engaged with the electro-optical back plane 1200 using separate fibers 1224 on the board 1230 slotted into the electro optical back plane 1200 via both the electrical connectors 1222 and their corresponding optical connectors 1220. Purely optical devices 1250 may also be plugged into the back plane 1200. For example an optical switch 1252 is shown being connected to optical connectors 1220 alone, as is a splitter coupler device 1254.

The present invention has been described in terms of preferred embodiments, however, it will be appreciated that various modifications and improvements may be made to the described embodiments without departing from the scope of the invention.

What is claimed is:

1. A circuit board, comprising:
   a plurality of layers;
   an optical fiber embedded within the layers;
   a right angle interface body connected to the optical fiber and embedded within the layers, the right angle interface body has one or more first optical paths and one or more second optical paths, each of the first optical paths being optically coupled to a corresponding second optical path, wherein the first optical paths are disposed in a first plane and the one or more second optical paths are disposed in a second plane, the first and second planes being at substantially a right angle with respect to one another; and a registration plate having at least one alignment hole, and wherein the right angle interface body further comprises at least one anchor member extending downwardly from a bottom side of the right angle interface body and received in the alignment hole of the registration plate.

2. The circuit board of claim 1, further comprising a protective covering on a top surface of the right angle interface body covering the first optical paths.

3. The circuit board of claim 2, wherein the protective covering is a copper tape.

4. The circuit board of claim 1, further comprising an outer copper foil layered on as a top layer.

5. The circuit board of claim 1, wherein the right angle interface body has a tapered sidewall.

* * * * *